United States Patent
Chantre et al.

(10) Patent No.: US 6,403,437 B1
(45) Date of Patent: Jun. 11, 2002

(54) METHOD FOR MAKING HYPERFREQUENCY TRANSISTOR

(75) Inventors: Alain Chantre, Seyssins; Jean Du Port De Poncharra, Quaix-en-Chartreuse, both of (FR)

(73) Assignees: Commissariat a l'Energie Atomique; France Telecom, both of Paris (FR)

( * ) Notice: Subject to any disclaimer, the term of this patent is extended or adjusted under 35 U.S.C. 154(b) by 0 days.

(21) Appl. No.: 09/445,425
(22) PCT Filed: Jun. 10, 1998
(86) PCT No.: PCT/FR98/01183
§ 371 (c)(1), (2), (4) Date: Dec. 29, 1999
(87) PCT Pub. No.: WO98/57367
PCT Pub. Date: Dec. 17, 1998

(30) Foreign Application Priority Data

Jun. 11, 1997 (FR) ............................................. 97 07237

(51) Int. Cl.[7] .......................................... H01L 21/8222
(52) U.S. Cl. ........................................................ 438/313
(58) Field of Search .......................... 438/307, 313–322, 438/336, 309, 341

(56) References Cited

U.S. PATENT DOCUMENTS 5,352,624 A * 10/1994 Miwa et al. .................... 437/63

* cited by examiner

*Primary Examiner*—David Nelms
*Assistant Examiner*—Thao P Le
(74) *Attorney, Agent, or Firm*—Oblon, Spivak, McClelland, Maier & Neustadt, P.C.

(57) ABSTRACT

A bipolar transistor including an extrinsic base on the surface of a silicon substrate covered by a first layer of doped polycrystalline silicon, an intrinsic base that is separated from the extrinsic base and covered by a second layer of polycrystalline silicon that constitutes the emitter and that is insulated from the first layer of polycrystalline silicon, and a link base that links the extrinsic base to the intrinsic base. The link base is located under the first layer of doped polycrystalline silicon.

5 Claims, 4 Drawing Sheets

METHOD FOR MAKING HYPERFREQUENCY TRANSISTOR

FIELD OF THE INVENTION

The present invention relates to a bipolar transistor with a semi-aligned structure and the method for producing such a transistor. The invention particularly relates to the production of hyperfrequency bipolar transistors. The invention therefore relates to the field of microelectronics on silicon, particularly for producing bipolar integrated circuits and BiCMOS (Bipolar Complementary Metal Oxide Semiconductor) circuits.

The invention has applications in the production of logic circuits, analog circuits and particularly radiofrequency circuits.

BACKGROUND ART

Transistors said to have an auto-aligned double-polysilicon structure are known in the art. Given their outstanding operating speed, these transistors offer the highest performance levels available today. Their high operating speed results from the auto-aligning character of the component parts of these transistors that also ensures the accuracy of their construction. Moreover, the auto-aligned structure enables transistors to be obtained that are small and perfectly suited to producing integrated circuits. Documents (1) and (2) may be referred to for further information concerning this subject. The references of the documents are given at the end of the present description.

The structure and manufacture of a bipolar transistor of the type mentioned above are briefly described with reference to FIGS. 1 to 3 attached.

A transistor formation zone 102 is first defined on a silicon substrate 100 by creating thick zones of silicon oxide 104 using the "LOCOS" (Local Oxidation of Silicon) technique on the surface of the substrate. Next a first layer of polycrystalline silicon 106 doped with boron and an insulating layer 108 of silicon oxide or silicon nitride are deposited successively on the surface of the silicon substrate.

Reference 110 in FIG. 1 indicates an N+ layer that is doped with arsenic and embedded in substrate 100. This layer constitutes the transistor collector that is subsequently created.

An etching mask 112 is formed on insulating layer 108. The mask includes an aperture that defines the subsequent position of the transistor emitter.

FIG. 2 shows the next stage in which a window 114 is made through polycrystalline silicon layer 106 and insulating layer 108 in order to reveal an area of silicon substrate 100. The position of the window is determined by the aperture in mask 112 on insulating layer 108.

Window 114 is made using an anisotropic reactive ionic etching technique. The depth of the etching is adjusted by varying the length of etching time.

However, when the etching time is insufficient a section of the doped polycrystalline silicon layer 106 remains at the bottom of window 114. Under these circumstances the transistor base that will be made later lies in this section of the polycrystalline silicon layer and the resulting transistor is unusable because it has zero gain.

In order to avoid this situation sufficient etching time is chosen to ensure the polycrystalline silicon is completely eliminated from the window. However, in this event the silicon from the substrate is also attacked and part of window 114 extends into substrate 100. This phenomenon, shown in FIG. 2, is referred to as "over-etching" in the text that follows.

The following stage shown in FIG. 3 mainly concerns production of the transistor emitter in window 114. The emitter comprises an N+-type polycrystalline silicon layer 116 that is doped with arsenic. It is electrically insulated from the sides of window 114 by a thin layer of thermal oxide 118 and lateral spacers 120 that cover the sides. The emitter is also insulated from the first polycrystalline silicon layer 106 by insulating layer 108.

It should be noted that boron ions are embedded in substrate 100 via window 114 before polycrystalline silicon layer 116 is formed on the emitter. This embedding enables a base area, called an intrinsic base, to be created in the substrate. This area is referred to as 122 in FIG. 3.

The thermal treatment used to create thermal oxide layer 118, or indeed any other thermal treatment used after the emitter has been created, causes doping impurities to be diffused both from the first polycrystalline silicon layer 106 and the polycrystalline silicon layer 116 constituting the emitter into the silicon substrate.

The impurities, particularly boron, being diffused into the substrate from the first polycrystalline silicon layer 106 enable doped areas to be formed that are called "extrinsic bases" in the text that follows. These areas are referred to as 124 in FIG. 3. Arsenic also being diffused into the substrate 100 from the first polycrystalline silicon layer 116 extends the emitter with an emitter area that is in contact with intrinsic base 122. The emitter area diffused in the substrate is referred to as 126 in FIG. 3.

It may be noted that the extrinsic and intrinsic base areas in FIG. 3 are slightly overlapping. Overlapping is necessary to ensure electrical continuity between extrinsic base 124 and intrinsic base 122 and to enable said intrinsic base to be addressed. A base contact point (not shown in FIG. 3) is provided on the first layer of doped polycrystalline silicon that is in contact with extrinsic base 124.

The extrinsic base 124 area and the emitter area both have high levels of doping. Consequently, in order to avoid the risk of electrical leaks from the transistor it is essential for there to be sufficient distance between these areas.

The method for manufacturing bipolar transistors described above and the transistors obtained using the method have a certain number of drawbacks that have a negative influence on performance levels and on the production output of integrated circuits that include such transistors.

When the over-etching of window 114 (FIG. 2) is very deep the diffused area that constitutes the extrinsic base no longer extends as far as the section of the substrate under the emitter. There is then the risk of the electrical contact between the extrinsic and intrinsic bases being eliminated. In this event the intrinsic base remains without electrical access. Furthermore, a high level of over-etching reduces the distance between intrinsic base 122 and the embedded collector layer 110 (FIG. 3). The lack of distance reduces the resistance voltage between the base and the collector and channeling or avalanche breakdown could occur in the transistor.

Etching of window 114 and over-etching in the silicon of the substrate can also induce crystallographic defects on the emitter-base interface. These defects lead to current leakage from the emitter-base junction that affects the current gain from the transistor. Furthermore, the anisotropic character of the etching of window 114 causes roughness on the emitter-base interface. The roughness affects the result of the chemical treatments to which the substrate is subjected when the transistor is manufactured. For example, a negative occurrence may arise concerning the oxidation speed or the cleaning quality between the various production stages. It is impossible to control the effects caused by roughness.

Therefore the auto-aligning structures described above mainly pose the problem of over-etching the emitter window. In order to avoid major over-etching it is necessary for the polycrystalline silicon etching to be accurately controlled which often proves difficult if production is on an industrial scale.

Another production method called "semi-auto-aligning" is also known. The method facilitates the manufacture of transistors while avoiding over-etching of the substrate and the above-mentioned drawbacks. The method is described below with reference to FIGS. 4 to 6.

Part of the preceding description is not repeated given the great similarity between the structures shown in FIGS. 4 to 6 and those in FIGS. 1 to 3. They may, however, be referred to for clearer understanding of the drawings. Furthermore, to simplify the drawing components that are identical or similar to those in FIGS. 1 to 3 have the same reference numbers with the addition of 100.

On the whole the structure shown in FIG. 4 differs from that in FIG. 2 by a sticker 203 that is deposited on substrate 200 in transistor formation zone 202. Sticker 203 is a layer of silicon oxide that is between 20 and 50 nm thick. Said sticker is used as an etching stopping layer and is explained below. Sticker 203 is deposited after the thick insulating zones 204 that define the transistor formation zone 202 have been deposited and before doped polycrystalline silicon layer 206 and insulation layer 208 are deposited.

FIG. 4 also shows a layer 210 that constitutes the collector and that is embedded in substrate 200, and an etching mask 212 on insulation layer 208 to define the position of the emitter window etching. For this to be possible mask 212 has an etching aperture located above sticker 203.

The surface of sticker 203 is greater than the measurements of the aperture provided in the mask to etch the emitter window. Therefore, the difference in size between the mask aperture and the sticker is compatible with the possibilities of alignment photo-repeaters that is typically 0.2 $\mu$m.

The next stage, illustrated in FIG. 5, consists in etching an emitter window 214 through doped polycrystalline silicon layer 206 and insulation layer 208. The etching, for example using reactive ions, is stopped by sticker 203. It should be noted that the layer of silicon oxide that constitutes the sticker is sufficiently thick to ensure the etching is stopped and to prevent any over-etching of substrate 200.

After the polycrystalline silicon has been etched deoxidization also eliminates the section of the sticker that has been revealed at the bottom of the emitter window.

These operations are followed by an area of intrinsic base 222 at the bottom of the emitter window being implanted, a layer of thermal oxide 218 and spacers 220 being created on the sides of the emitter window and finally by a doped polycrystalline silicon layer 216 being formed to constitute the emitter in the emitter window. These sections are shown in FIG. 6.

As shown in FIG. 6, a thermal treatment, for example to form thermal oxide layer 218, is used to diffuse the doping species from doped polycrystalline silicon layer 206 into substrate 200 where areas of extrinsic base 224 are created, as described above with reference to FIG. 3.

However, unlike the structure in FIG. 3 it should be noted that in the structure in FIG. 6 there is a risk of there being no contact between the areas of intrinsic base 222 and extrinsic base 224. The lack of contact is due to offsetting resulting from the section of sticker 203 that remains on the surface of the substrate. The remaining section of sticker 203 outside the emitter window prevents the doping impurities from doped polycrystalline silicon layer 206 from being diffused into subjacent substrate 200.

In this event the transistor is inoperative because there is no longer any electrical access to the intrinsic base.

In order to avoid this phenomenon the measurements of sticker 203 have to be reduced such that said sticker is only slightly wider than the emitter window.

However, this solution is not advantageous for production on an industrial scale as the alignment between the aperture of the mask and the sticker is crucial.

Another solution is to create a base area in all the production area of transistor 202 (see FIG. 4) by implanting suitable doping impurities in the silicon substrate. In this event the implantation is performed before the sticker and the other layers described above are created.

A method of this kind not only enables over-etching of the substrate to be avoided due to the sticker but also ensures electrical contact with the base of the transistor.

However, when the base is created during the initial stages in which the transistor is created the doping impurities implanted in the substrate to produce the base continue to diffuse during the subsequent stages and particularly during the stages that require thermal treatment.

The additional diffusion of doping impurities already implanted in the substrate causes the base area of the transistor to widen. However, when the base is wider the transistor loses operating speed because the transit time of the electrons in the base increases.

The operating frequency of circuits in transistors of this kind is therefore reduced.

DISCLOSURE OF THE INVENTION

The aim of the present invention is to propose a production method of a bipolar transistor that does not have the drawbacks described above.

One particular aim is to avoid the problems of over-etching of the emitter window and the problems of alignment between the etching mask and an etching stopping sticker.

The invention also aims at avoiding excessive diffusion from the base areas and the losses of operating speed caused by said excessive diffusion.

Another aim is to ensure electrical access to the base, particularly to an intrinsic base area that is in contact with the emitter.

Finally, the invention aims at proposing an inexpensive transistor that is suited for the production of integrated circuits on an industrial scale.

More precisely, in order to attain these aims, the object of the invention is a production method of a bipolar transistor on a silicon substrate with a embedded collector layer that comprises the following successive stages:

a) creating a first layer, called a sticker, of undoped thermal oxide that covers part of a transistor formation zone of the substrate, b) forming a first layer of doped polycrystalline silicon that covers the transistor formation zone and the first layer of sticker, and an electrical insulation layer that covers the layer of doped polycrystalline silicon, c) etching the electrical insulation layer and the first layer of doped polycrystalline silicon that stops etching at the first layer of sticker in order to cut a window, called a emitter window, above a section of first layer of sticker, d) implanting doping impurities to create a base area, called an intrinsic base, in the substrate under the emitter window and eliminating the first layer of sticker from the emitter window, e) laterally insulating the sides of the emitter window and forming a second layer of polycrystalline silicon, called the emitting layer, the method also comprising at least one thermal treatment stage to create a base area, called an extrinsic base, by diffusing doping impurities from the first layer of doped polycrystalline silicon into the substrate, outside an area covered by the first layer of sticker, to create a base area, called a link base, that links the extrinsic base and the intrinsic base, by diffusing doping impurities into the substrate through the first layer of sticker, said first layer of sticker being sufficiently thick to constitute a layer to stop the etching in stage c) and sufficiently thin to enable impurities to be diffused through the layer during the thermal treatment stage.

The doping species being diffused through the first layer of sticker that exists around the emitter window ensures electrical contact between the extrinsic base and the intrinsic base, irrespective of the size of the sticker layer.

The sticker can therefore be of a size to avoid the etching of the insulation layer being crucial.

Also the first layer of sticker avoids over-etching of the substrate and the problems caused by such over-etching.

As an example, the first layer of sticker can be a layer of silicon oxide between 3 and 10 nm thick.

In order to ensure the transistor operates correctly long term it is important to use undoped thermal oxide for the first layer of the sticker.

The use of undoped thermal oxide avoids direct contact between the source of doping, that is constituted by the doped polycrystalline silicon, and the silicon in the intrinsic area of the transistor. Therefore, any risk of unintended boron contamination is avoided in this area.

Furthermore, the use of a thermal oxide ensures a high quality silicon/oxide interface in the active zone, particularly where the emitter-base junction opens. Compared to an oxide that is deposited and that is less dense, thermal oxide deteriorates more slowly when subjected to heat carriers during reverse polarization of the emitter-base junction. The service life of the transistor is therefore considerably increased.

An additional advantage is that when the first layer of sticker is formed the thermal oxide can also be used to create the grid insulator for a MOS transistor in the event of BiCMOS structures being created that combine bipolar and MOS transistors. In this case the polycrystalline silicon that is subsequently created can also be used to produce MOS transistor grids.

According to an advantageous implementation of the method the thermal treatment can take place during stage e) when a thermal oxide layer is formed that covers the sides of the emitter window.

Therefore, a single thermal process is used to form a thermal oxide layer that covers the surfaces of the emitter window and to diffuse the doping impurities from the polycrystalline silicon layer into the substrate to create the extrinsic base area and the link base. The thermal oxide layer is eliminated from the bottom of the window before the emitting layer is formed.

According to one improvement stage a) of the method may also include forming a second layer of sticker that covers the first layer of sticker, the second layer of sticker being made of doped polysilicon and constituting a reservoir of doping impurities to create a link base area.

This improvement is particularly advantageous. It enables the concentration of dopants in the intermediary base and link base regions to be independently controlled by adjusting the doping of the first polycrystalline silicon layer and the second sticker layer respectively.

In particular a higher degree of doping of the second sticker layer compensates for the impurities that are only partially stopped by the by the first sticker layer. Therefore extrinsic base and link base areas are obtained with a more or less uniform concentration of dopants.

Advantageously, the first sticker layer can be a layer of silicon oxide ($SiO_2$) and the second sticker layer can be a layer of polycrystalline silicon doped with boron fluoride ($BF_2$).

The presence of fluorine in the second sticker layer facilitates the diffusion of boron through the first sticker layer.

The invention also relates to a bipolar transistor comprising a base on the surface of a silicon substrate, called an extrinsic base, covered by a first layer of doped polycrystalline silicon, a base called an intrinsic base that is separated from the extrinsic base and covered by a second layer of polycrystalline silicon that constitutes the emitter and that is insulated from the first layer of polycrystalline silicon, and a third base, called a link base, that links the extrinsic base to the intrinsic base. According to the invention most of the link base is located under the first layer of doped polycrystalline silicon.

As the link base is located under the first layer of doped polycrystalline silicon contact is ensured between the extrinsic base and the intrinsic base.

A transistor of this kind may be obtained using the method described above.

According to one particular feature the transistor can also comprise a silicon oxide layer that separates the link base from the first polycrystalline silicon layer.

This is the case particularly when the first sticker layer, that is formed during the production method, is large in size.

When a second sticker layer is formed the transistor also comprises an additional layer of doped polycrystalline silicon that is deposited on the silicon oxide layer and that separates the link base from the first polycrystalline silicon layer.

Other characteristics and advantages of the present invention will be better understood from the following detailed description of a non-limitative example which refers to the attached figures.

DETAILED DESCRIPTION OF AN IMPLEMENTATION OF THE INVENTION

Figure 1:
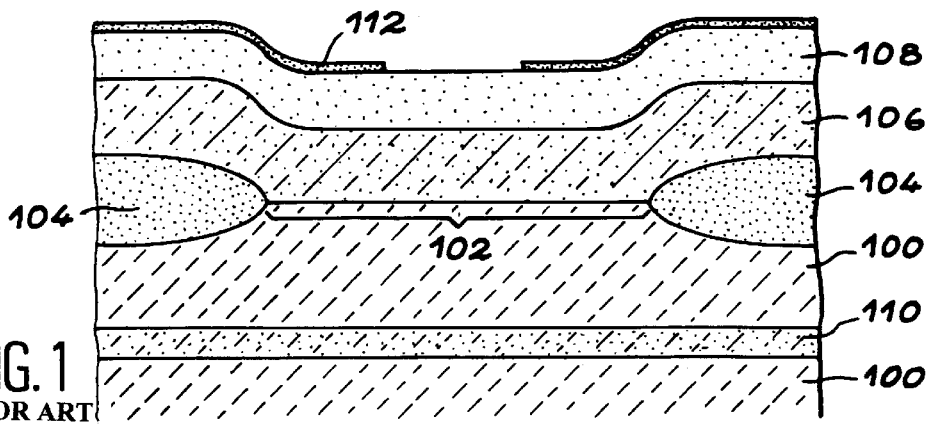
FIGS. 1 to 3, described above, are schematic cross sections of a bipolar transistor structure during the successive stages of a known production method, FIGS. 4 to 6, described above, are schematic cross sections of a bipolar transistor structure during the successive stages of another known production method, FIGS. 7 to 10, described above, are schematic cross sections of a bipolar transistor structure during the successive stages of production according to a particular implementation of the method of the invention.
Figure 2:
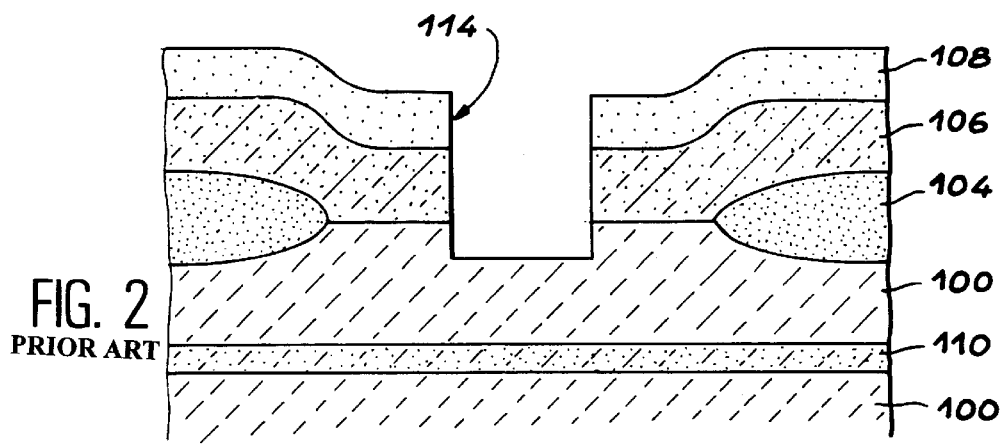
Figure 3:
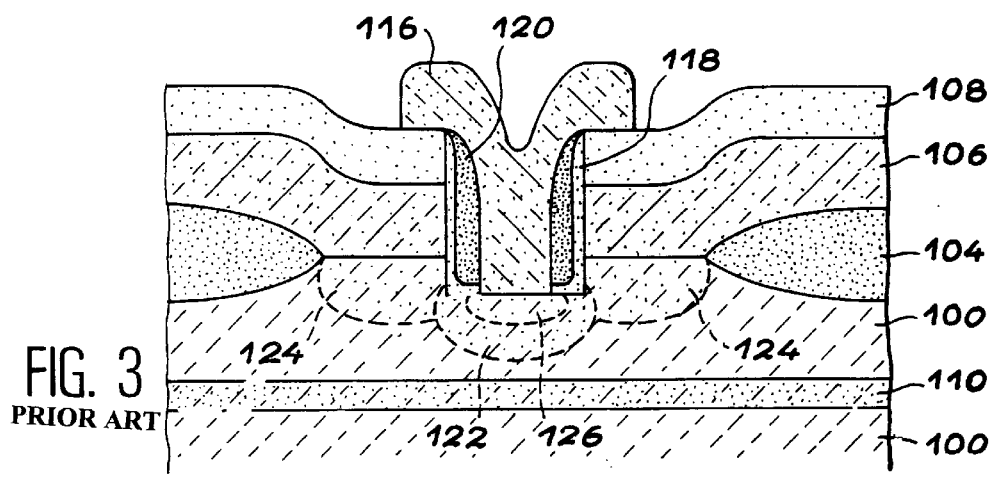
Figure 4:
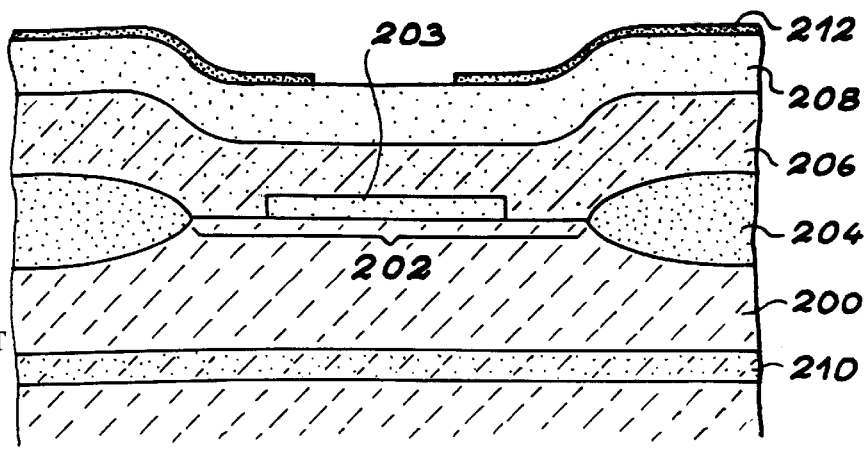
Figure 5:
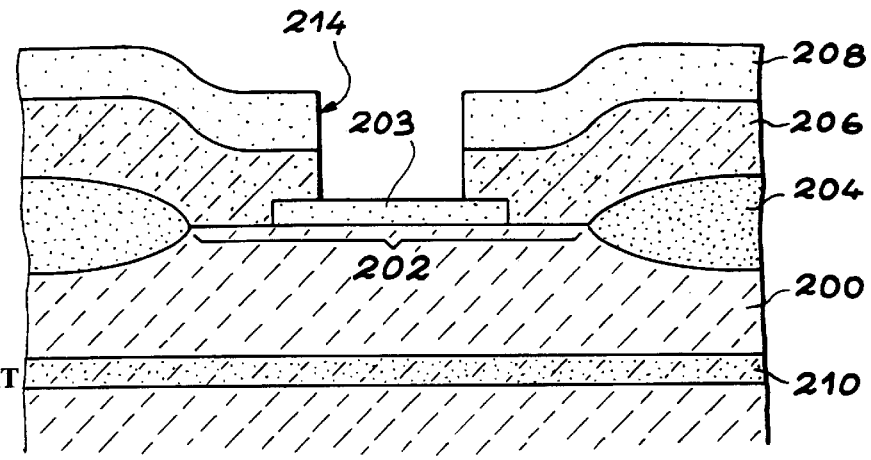
Figure 6:
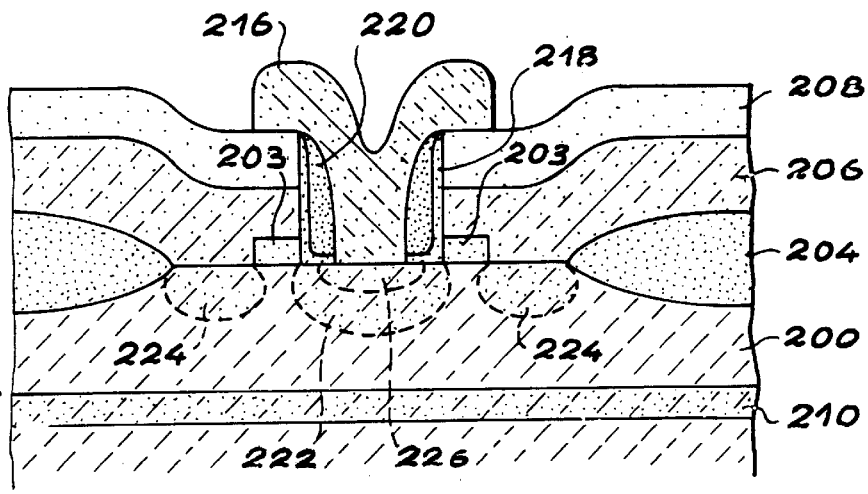

In FIGS. 7 to 10 described below sections that are identical or similar to those in FIGS. 4 to 6 bear the same reference numbers with the addition of 100.

Figure 7:
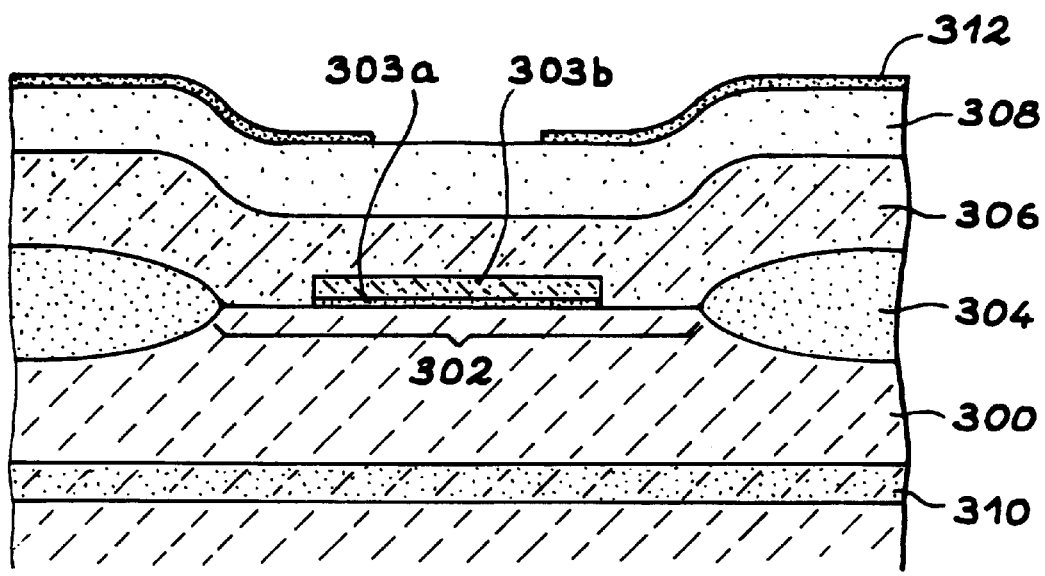

The manufacture of a transistor begins with the formation of thick oxide zones 304 that define a transistor formation zone 302 on a silicon substrate 300, as shown in FIG. 7. The measurements of this zone are between 1.1 and 1.8 µm.

Zones 304 are created by local oxidation of the silicon of the substrate according to a known technique that is usually referred to as the "LOCOS" technique. The zones are between 0.5 and 0.6 µm thick.

The two successive layers, respectively silicon oxide and polycrystalline silicon, are then deposited and shaped to constitute the stickers referred to as 303a and 303b. The stickers are shaped using standard photolithography techniques.

The first sticker layer is a layer of silicon oxide the thickness of which is between 3 and 10 nm and that is preferably equal to 5 nm. The thickness of the layer is controlled to allow doping impurities to be diffused subsequently through the layer while retaining the etching stopping properties described below.

The second sticker layer 303b is a layer of polycrystalline silicon that is, for example, between 30 nm and 50 nm thick. It is doped with boron fluoride $BF_2$. The concentration of doping impurities is, for example, between $10^{19}$ to $10^{20}$ $cm^{-3}$.

A first layer of polycrystalline silicon 306 doped $P^+$ with boron is then deposited on substrate 300 in order to cover stickers 303a, 303b and all the transistor formation zone 302. The first layer of polycrystalline silicon 306 is between 100 and 300 nm thick and has a concentration of boron impurities of between $10^{19}$ to $10^{20}$ $cm^{-3}$.

A layer 308 of oxide or silicon nitride is then deposited over all the first layer of polycrystalline silicon. The layer of oxide or silicon nitride is an electrical insulation layer. It is also between 100 nm and 300 nm thick.

Finally an etching mask 312, made of photosensitive resin, is formed on insulation layer 308. The mask has an aperture that is more or less aligned with stickers 303a, 303b. In order to avoid the alignment being critical the measurements of the aperture, that are between 0.5 µm and 0.8 µm, are chosen preferably slightly smaller than those of the stickers.

The aperture of mask 312 is more or less in the center of transistor formation zone 302, as are stickers 303a, 303b.

Figure 8:
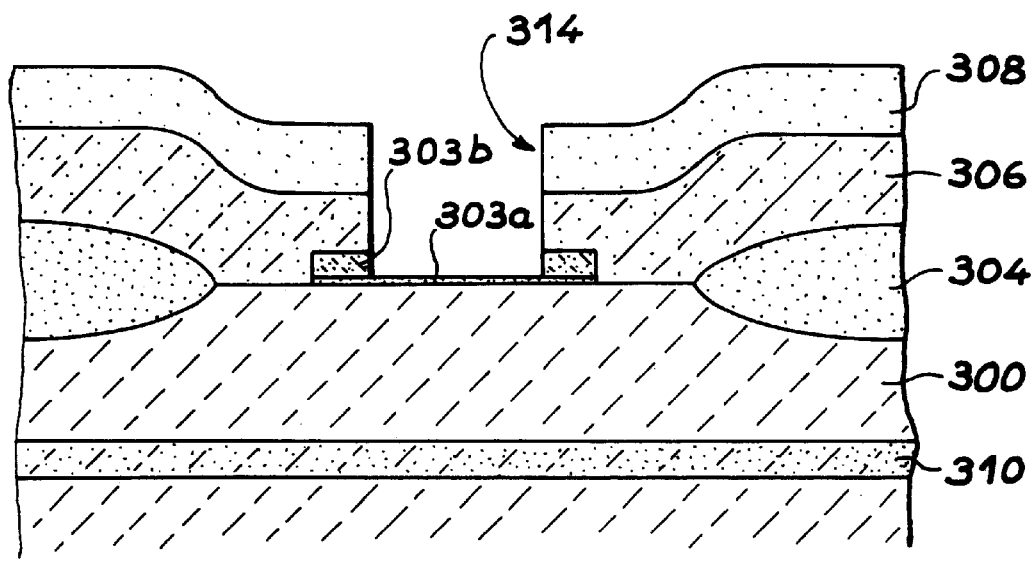

Successive etching of insulation layer 308 and polycrystalline silicon layers 306, 303b through the aperture of the mask enable a window 314, called a, emitter window, to be cut. The etching, for example anisotropic reactive ionic etching, is stopped by the first sticker layer 303a made of silicon oxide. This layer is revealed at the bottom of window 314, as shown in FIG. 8.

The diameter of the window is between 0.5 and 0.8 µm. When the window is centered in transistor formation zone 302 it remains separated from oxide zones 304 by a distance of between 0.3 and 0.5 µm.

The silicon oxide of the first sticker layer, that is revealed at the bottom of the window, can be eliminated once emitter window 314 has been etched. Etching mask 312 can also be eliminated.

Figure 9:
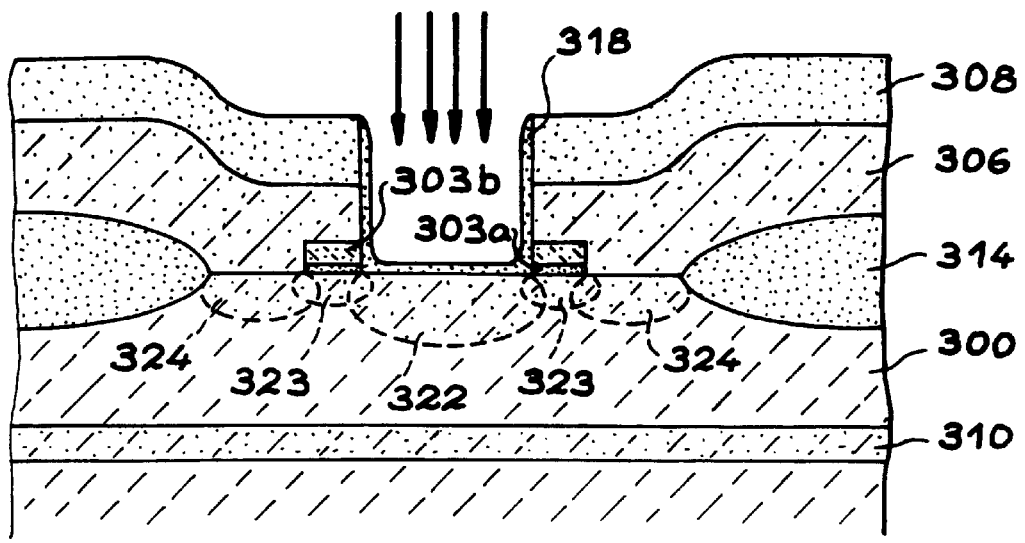

A thin layer of oxide 318, for example thermal oxide, is formed in order to coat all the surfaces of the emitter window and particularly the sides, as shown in FIG. 9.

An implantation of low energy boron ions, between 5 to 20 KeV (for example 7 KeV), is made in window 314 in order to create an intrinsic base area 322 in substrate 300 under the window. The concentration of doping impurities in this area is approximately $10^{18}$ $cm^{-3}$. The implantation is represented summarily by arrows in FIG. 9.

Thermal treatment made at a temperature of between 700° C. and 950° C., advantageously at 850° C., for a few minutes can be used to form the above-mentioned thermal oxide layer 318. The thermal treatment also enables the boron to be diffused from the first layer of polycrystalline silicon 306 into substrate 300 to create areas called extrinsic bases 324 in said substrate. The concentration of doping impurities in these areas is approximately $10^{20}$ $cm^{-3}$.

The thermal treatment also enables the boron to be diffused from second sticker layer 303b, that exists on either side of emitter window 314, into substrate 300 through the remaining section of first sticker layer 303a. This diffusion, which is facilitated by the presence of fluorine, enables doped areas called "link bases" to be created.

The concentration of doping impurities in the link bases is between $5.10^{19}$ $cm^{-3}$ and $8.10^{19}$ $cm^{-3}$. These link bases ensure electrical continuity between the intrinsic base and the extrinsic base.

Figure 10:
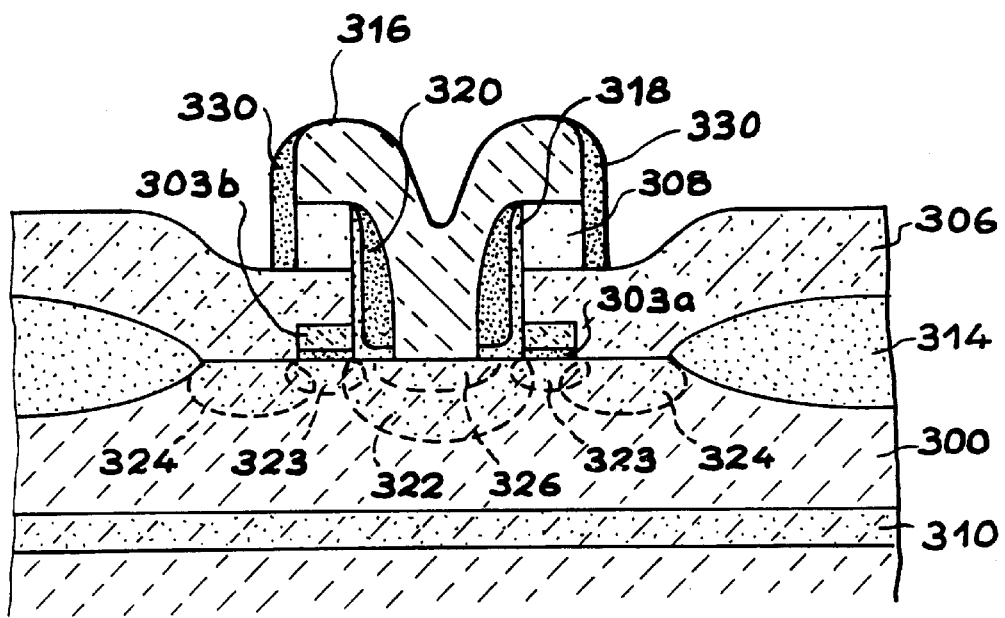
FIG. 10 also shows a cross section of the transistor structure according to the invention that is finally obtained at the end of the method.

FIG. 10 shows the next stage in which the emitter is created in the emitter window.

Lateral spacers 320 made of silicon nitride are created on the sides of the emitter window on thermal oxide layer 318 in order to avoid any electrical contact with the first layer of polycrystalline silicon 306. The spacers are created by a layer of silicon nitride being deposited followed by anisotropic etching of said layer.

When lateral spacers 320 have been created emitter window 314 is deoxidized to eliminate the thermal oxide at the bottom and a new layer of polycrystalline silicon 316 is formed.

This layer of polycrystalline silicon 316, called an emitter layer, is doped with arsenic to a concentration of $10^{20}$ $cm^{-3}$. The layer is between 200 and 400 nm thick.

The emitter layer 316 and the subjacent insulation layer 308 are then shaped in a new photolithography stage. The outer sides of emitter layer 316 can be protected by a side insulating coating of nitride or silicon oxide. This coating is shown as reference 330 in FIG. 10.

A new thermal treatment can also be implemented. This thermal treatment, that is preferably carried out at a temperature of between 950 and 1050° C. over between 5 and 20 seconds (for example at 1025° C. for 20 seconds), completes the diffusion from base areas 322, 323, 324 described above. The thermal treatment results in diffusion from area 322 that is doped with N and that extends the emitter layer into substrate 300. This area is called the emitter area and bears reference number 326.

In FIG. 10 it may be noted that in the transistor that is finally obtained link base 323 is mainly located under the first layer of doped polycrystalline silicon 306 and is separated from said layer of doped polycrystalline silicon by a layer of silicon oxide from first sticker 303a and by a layer of polycrystalline silicon 303b from the second sticker.

As mentioned in the first part of the description, the differences in concentration of doping between first layer of polycrystalline silicon 306 and the polycrystalline silicon layer of second sticker 303b enable the concentrations of the extrinsic base and the link base to be accurately and independently adjusted.

The description given above relates to an n-p-n or similar bipolar transistor. The p type dopings are simply replaced by n type dopings and vice versa for p-n-p transistors.

The manufacture of transistors can also be completed by contact points on the base, emitter and collector areas and by creating electrical connecting lines between the transistors in order to create integrated circuits.

REFERENCE DOCUMENTS

1) A new technique for forming a shallow link base in a double polysilicon bipolar transistor J. D. Hayden, Senior Member, IEEE, J. D. Burnett, J. R. Pfiester, Senior member, IEE and M. P. Woo IEEE transactions on electron devices, vol. 41, No. 1, January 1994, pages 63–67.
2) An ultra-shallow link base of a double polysilicon bipolar transistor J. D. Hayden, J. D. Burnett, J. R. Pfiester and M. P. Woo, Advanced Products Research and Development Laboratory, Motorola Inc., IEEE 1992 Bipolar Circuits and Technology Meeting 4.5, pages 96–99.

What is claimed is:

1. A method of producing a bipolar transistor on a silicon substrate with an embedded collector layer comprising the following successive stages:
    a) creating a first sticker layer of undoped thermal oxide that covers part of a transistor formation zone of the substrate;
    b) forming a first doped polycrystalline silicon layer that covers the transistor formation zone and the first sticker layer, and an electrical insulation layer that covers the first doped polycrystalline silicon layer;
    c) etching the electrical insulation layer and the first doped polycrystalline silicon layer until the first sticker layer stops the etching so as to cut an emitter window above a section of the first sticker layer;
    d) implanting doping impurities to create an intrinsic base area in the substrate under the emitter window and eliminating the first sticker layer from the emitter window; and
    e) laterally insulating sides of the emitter window and forming a second polycrystalline silicon layer to serve as an emitter layer, wherein the method further includes at least one thermal treatment stage comprising the following steps:

forming an extrinsic base area outside an area covered by the first sticker layer by diffusing doping impurities from the first doped polycrystalline silicon layer into the substrate layer;

forming a link base area that links the extrinsic base area and the intrinsic base area by diffusing doping impurities into the substrate through the first sticker layer, and wherein said first sticker layer is sufficiently thick to stop the etching in stage c) and is sufficiently thin to enable impurities to be diffused through the first sticker layer during the at least one thermal treatment stage.

2. The method of claim 1, wherein the first sticker layer comprises a silicon oxide layer between 3 and 10 nm thick.

3. The method of claim 1, wherein the at least one thermal treatment stage occurs during stage e) when a thermal oxide layer is formed that covers the sides of the emitter window.

4. The method of claim 1, wherein stage a) also includes forming a second sticker layer that covers the first sticker layer, and wherein the second sticker layer includes doped polysilicon and forms a reservoir of doping impurities to create the link base area.

5. The method of claim 4, wherein the first sticker layer comprises a silicon oxide layer, and wherein the second sticker layer comprises a polycrystalline silicon layer doped with boron fluoride.

* * * * *